United States Patent
Matejka et al.

(10) Patent No.: US 11,079,338 B2
(45) Date of Patent: Aug. 3, 2021

(54) METHOD FOR DETECTING A STRUCTURE OF A LITHOGRAPHY MASK AND DEVICE FOR CARRYING OUT THE METHOD

(71) Applicant: Carl Zeiss SMT GmbH, Oberkochen (DE)

(72) Inventors: Ulrich Matejka, Jena (DE); Thomas Scheruebl, Jena (DE); Markus Koch, Neu-Ulm (DE); Christoph Husemann, Jena (DE); Lars Stoppe, Jena (DE); Beat Marco Mout, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 73 days.

(21) Appl. No.: 16/451,203

(22) Filed: Jun. 25, 2019

(65) Prior Publication Data
US 2019/0391087 A1  Dec. 26, 2019

(30) Foreign Application Priority Data

Jun. 25, 2018 (DE) .......................... 102018210315.1

(51) Int. Cl.
*G01N 21/956* (2006.01)
*G01N 21/33* (2006.01)
(Continued)

(52) U.S. Cl.
CPC ....... *G01N 21/956* (2013.01); *G01B 9/02083* (2013.01); *G01N 21/33* (2013.01); *G03F 1/84* (2013.01); *G01N 2021/95676* (2013.01)

(58) Field of Classification Search
CPC ............... G01B 9/02083; G01B 11/14; G01B 11/2441; G01N 21/33; G01N 21/956; G01N 2021/95676; G03F 1/84
See application file for complete search history.

(56) References Cited

U.S. PATENT DOCUMENTS 7,541,115 B1 * 6/2009 Volk ...................... B82Y 10/00
                                            430/394
9,075,227 B2   7/2015 Rachet et al.
(Continued)

FOREIGN PATENT DOCUMENTS

CN         1697974     11/2005    ........... G01N 33/543
CN       101377413      3/2009    ............. G01B 11/25
(Continued)

OTHER PUBLICATIONS

German Examination Report for German Application No. DE 10 2018 210 315.1 dated May 2, 2019 (with English Translation).
(Continued)

*Primary Examiner* — Mark R Gaworecki
(74) *Attorney, Agent, or Firm* — Fish & Richardson P.C.

(57) ABSTRACT

In detecting the structure of a lithography mask, a portion of the lithography mask is firstly illuminated with illumination light of an at least partially coherent light source in the at least one preferred illumination direction. A diffraction image of the illuminated portion is then recorded by spatially resolved detection of a diffraction intensity of the illumination light diffracted from the illuminated portion in a detection plane. The steps of "illuminating" and "recording the diffraction image" are then carried out for further portions of the lithography mask. Between at least two portions of the lithography mask that are thereby detected, there is in each case an overlap region whose surface extent measures at least 5% or more of the smaller of the two portions of the lithography mask. The repetition takes place until the detected portions of the lithography mask completely cover a region of the lithography mask to be detected. The structure of the lithography mask is calculated from the recorded diffraction images of the illuminated portions. A device for carrying out the structure detection method is also specified, which comprises a light source, a spatially-resolv- (Continued)

ing detector and a mask holder. This results in a method and a device for detecting the structure of a lithography mask, in which the demands placed on an optical unit arranged downstream in the beam path from the illumination light of the lithography mask are reduced.

30 Claims, 10 Drawing Sheets

(51) Int. Cl.
*G01B 9/02* (2006.01)
*G03F 1/84* (2012.01)

(56) References Cited

U.S. PATENT DOCUMENTS

| | | | |
|---|---|---|---|
| 9,310,313 | B1 | 4/2016 | Wilson |
| 10,068,325 | B2 | 9/2018 | Matejka et al. |
| 10,634,886 | B2 | 4/2020 | Matejka et al. |
| 2005/0036149 | A1 | 2/2005 | Hill |
| 2006/0160245 | A1 | 7/2006 | Kaylor et al. |
| 2010/0111402 | A1 | 5/2010 | Lee et al. |
| 2013/0128251 | A1 | 5/2013 | Mann |
| 2013/0248728 | A1 | 9/2013 | Arnold et al. |
| 2014/0340663 | A1 | 11/2014 | Scaccabarozzi et al. |
| 2017/0131528 | A1 | 5/2017 | Ruoff et al. |
| 2017/0132782 | A1 | 5/2017 | Matejka et al. |
| 2017/0268869 | A1 | 9/2017 | Levinski et al. |
| 2018/0357758 | A1 | 12/2018 | Matejka et al. |
| 2018/0373158 | A1 | 12/2018 | Baier et al. |

FOREIGN PATENT DOCUMENTS

| | | | | |
|---|---|---|---|---|
| CN | 103797329 | 5/2014 | ............. | G01B 11/30 |
| CN | 106575088 | 4/2017 | ............. | G03F 7/20 |
| CN | 106873135 | 6/2017 | ............. | G02B 17/06 |
| CN | 107110779 | 8/2017 | ............. | G01N 21/47 |
| CN | 108027320 | 5/2018 | ............. | G01N 21/47 |
| EP | 1869399 | 12/2007 | | |
| JP | 2014-106451 | 6/2014 | ............... | G03F 1/26 |
| KR | 1020100042924 | 4/2010 | ............ | H01L 12/027 |
| KR | 1020170039215 | 4/2017 | ............. | G02B 27/09 |
| WO | WO 2007/008265 | 1/2007 | ............... | G01B 9/02 |
| WO | WO 2016/012426 | 1/2016 | ............. | G02B 17/08 |
| WO | WO 2017/153165 | 9/2017 | ............... | G03F 7/20 |
| WO | WO 2018/007211 | 1/2018 | ............... | G01B 9/02 |

OTHER PUBLICATIONS

Faulkner et al., "Movable Aperture Lensless Transmission Microscopy: A Novel Phase Retrieval Algorithm" Physical Review Letters, vol. 92, No. 2, pp. 023903-1-023903-4 (Jul. 2004).
Gardner et al., :"High numerical aperture reflection mode coherent diffraction microscopy using off-axis apertured illumination", *Optics Express*, vol. 20, No. 17, pp. 19050-19059 (Aug. 13, 2012).
Maiden et al, "Further improvements to the ptychographical iterative engine", *OPTICA*, vol. 4, No. 7, pp. 736-745 (Jul. 2017).
Maiden et al., "Superresolution imaging via ptychography", *J. Opt. Soc. Am.*, vol. 28, No. 4, pp. 604-612 (Apr. 2011).
Van den Broek et al., "General framework for quantitative three-dimensional reconstruction from arbitrary detection geometries in TEM", *Physical Review*, vol. B 87, pp. 184108-1-1084108-11 (2013).
Wojdyla et al., "EUV photolithography mask inspection using Fourier ptychography", *Proc. of SPIE*, vol. 10656, Image Sensing Technologies: Materials, Devices, Systems and Applications V, pp. 106560W-1-106560W-8 (May 29, 2018).
Zhang et al., "Full field tabletop EUV coherent diffractive imaging in a transmission geometry", *Optics Express*, vol. 21, No. 19, pp. 21970-21980 (Sep. 23, 2013).
Zhang et al., "Quantitative tabletop coherent diffraction imaging microscope for EUV lithography mask inspection", *Proc. of SPIE*, vol. 9050, Metrology, Inspection, and Process Control for Microlithography XXVIII, pp. 90501D-1-90501D-9 (Apr. 4, 2014).
Zhang et al., "Translation position determination in ptychographic coherent diffraction imaging", *Optics Express*, vol. 21, No. 11, pp. 13592-13606 (Jun. 3, 2013).
Kirchauer, "Photolithography Simulation", PhD Thesis, *Institute for Microelectronics*, TU Vienna (Apr. 17, 1998).
The First Office Action from the Chinese Patent Office for Chinese Application No. CN 201910558393.0, dated Oct. 22, 2020 (with English Translation).
The Notice of Reasons for Rejection from the Korean Patent Office for Korean Application No. KR 10-2019-0074992 dated Nov. 24, 2020 (with English Translation).
Li, Yao et al., "Point diffraction interference detection technology", *Chinese Optics*, vol. 10, No. 4, pp. 391-414 (Aug. 31, 2017) (English Abstract Only).
Mojarad, Nassir et al., "Interference lithography at EUV and soft X-ray wavelengths: Principles, methods, and applications", *Microelectronic Engineering*, vol. 143, pp. 55-63 (Mar. 28, 2015).
Zhang, Bosheng et al., "Quantitative tabletop coherent diffraction imaging microscope for EUV lithography mask inspection", Proceedings of SPIE, vol. 9050, pp. 90501D-1-90501D-9 (Apr. 2014).
Zhonghua, Hu et al., "Far-Field Multi-Parameter Measurement of Diffractive Optical Element for Pupil Shaping in Lithography System", *Chinese Journal of Lasers*, vol. 40, No. 9, pp. 0908001-1-0908001-5 (Sep. 30, 2013) (English Abstract Only).

* cited by examiner

METHOD FOR DETECTING A STRUCTURE OF A LITHOGRAPHY MASK AND DEVICE FOR CARRYING OUT THE METHOD

CROSS REFERENCE TO RELATED APPLICATION

This application claims priority under 35 U.S.C. § 119 to German Application DE 10 2018 210 315.1, filed on Jun. 25, 2018, the entire content of which is incorporated herein by reference.

TECHNICAL FIELD

The invention relates to a method for detecting a structure of a lithography mask. The invention further relates to a device for carrying out the method.

BACKGROUND

A method and a device for detecting a structure of a lithography mask are known from WO 2016/012426 A1. There, a 3D aerial image measurement takes place in the region around an image plane in the imaging of a lithography mask which is arranged in an object plane.

The specialist article "Quantitative tabletop coherent diffraction imaging microscope for EUV lithography mask inspection" by B. Zhang et al., proceedings of SPIE 9050, Metrology, Inspection, and Process Control for Microlithography XXVIII, 90501D (Apr. 2, 2014) discloses a structure detection method for the inspection of lithography masks. The specialist article "Translation position determination in ptychographic coherent diffraction imaging" by F. Zhang et al., Optics Express, vol. 21, no. 11, 2013 discloses a position estimation method using ptychography. The specialist article "EUV photolithography mask inspection using Fourier ptychography" by A. Wojdyla, proceedings SPIE 10656, Image Sensing Technologies: Materials, Devices, Systems, and Applications V, 106560W (May 29, 2018) discloses a device for the inspection of EUV lithography masks using Fourier ptychography.

SUMMARY

In a general aspect, the present invention provides a method and a device for detecting a structure of a lithography mask in such a way that demands placed on an optical unit arranged downstream in the beam path from the illumination light of the lithography mask are reduced.

The method for detecting a structure of a lithography mask includes: illuminating a portion of the lithography mask with illumination light of an at least partially coherent light source in at least one preferred illumination direction, recording a diffraction image of the illuminated portion by spatially resolved detection of a diffraction intensity of the illumination light diffracted from the illuminated portion in a detection plane, repeating the "illuminating" and "recording" steps for further portions of the lithography mask, wherein between at least two portions of the lithography mask that are thereby detected there is in each case an overlap region whose surface extent measures at least 5% of the smaller of the two portions, until the detected portions completely cover a region of the lithography mask to be detected, and calculating the structure of the lithography mask from the recorded diffraction images of the illuminated portions, wherein the illuminated portion is illuminated with several preferred illumination directions, wherein the diffraction image of the portion illuminated with these several preferred illumination directions is in each case recorded.

According to the invention, it has been found that, instead of structure detection by imaging, structure detection is also possible on the basis of measuring a diffraction image. A structure of the lithography mask to be detected can be the mask structure itself that is to be imaged in the projection exposure. The structure detection method is then used for mask qualification, for example in the manner of a metrology system from WO 2016/012426 A1. Alternatively or in addition, the structure to be detected can be a position marker on the lithography mask. The structure detection method is then used in a registration tool, which very precisely measures positions of structures on the lithography mask. The diffraction image can take place in the method entirely without interposition of an optical unit between the lithography mask and the detection plane. Alternatively, an optical unit can be used that has to meet demands that are generally less stringent than the demands placed on an imaging optical unit in an imaging structure detection method. In the detection method, the illuminated portion is illuminated with several preferred illumination directions, wherein the diffraction image of the portion illuminated with these several preferred illumination directions is in each case recorded. In a method of this kind, it is possible to use evaluation/calculation techniques which are known from the simulation, without a real mask, of an illumination and imaging of a lithography mask. An example of this is what is called non-Hopkins approximation. Corresponding simulation methods are known, for example, from the dissertation "Photolithography Simulation" by Heinrich Kirchauer, TU Vienna, March 1998.

In some implementations, a method in which the calculation of the structure of the lithography mask takes place using a method of coherent diffraction imaging or ptychography, diffraction images can be evaluated using established algorithms that are known from the field of coherent diffraction imaging (CDI) or ptychography.

In some implementations, a Fourier transformation is used in the calculation of the structure of the lithography mask from the recorded diffraction images, in which the Fourier transformation permits a change between the Fourier coordination of the recorded diffraction image and the position coordination of the lithography mask structure. Alternatively to a Fourier transformation, a mathematical convolution can also be used to calculate the structure of the lithography mask from the recorded diffraction images, which helps avoid edge value problems in the Fourier transformation.

An iterative Fourier transformation algorithm (IFTA) has proven useful as part of the structure detection method. Corresponding IFTA algorithms, used in connection with a structure reproduction, are known from the literature.

In some implementations, a degree of coherence of the light source is taken into consideration in the calculation of the structure of the lithography mask from the recorded diffraction images, and the taking into consideration of the degree of coherence or a coherence length improves the result of the structure detection method. Alternatively or in addition, it is possible to consider the numerical aperture of the illumination in the calculation of the portion structure. It can be coherent illumination. It can be partially coherent illumination. It can be Köhler illumination, which is discussed for example in the specialist text "Optik" by Dietrich Kithlke, Harri Deutsch Verlag, 2004.

In some implementations, the measured positions of the illuminated portions on the lithography mask are used in the calculation of a portion structure of the illuminated portion. These measured positions of the illuminated portions on the lithography mask can be made more precise in the calculation by an estimation within an error tolerance of the position measurement.

In some implementations, the measurement takes place through the pellicle, in which the illumination and/or the recording of the diffraction image can take place through the pellicle. A pellicle covering the lithography mask can then remain in place to protect the lithography mask during the performance of the structure detection method. The danger of contamination of the lithography mask during the structure detection method is then minimized.

If contaminating particles are present on the pellicle and the illumination is a coherent illumination, it can happen that the particles are not detected by the beam path of the illumination light. Even if they are detected, they can undesirably scatter just as much as if they were arranged on the lithography mask itself. This can have the undesired consequence that the effects of particles on the pellicle are either overestimated or underestimated or not detected at all.

This problem can be avoided or at least reduced if a partially coherent illumination is used for the illumination of a lithography mask with pellicle.

In a general aspect, a device for carrying out the method for detecting a structure of a lithography mask described above includes: a light source for providing the illumination light, a spatially resolving detector, arranged in the detection plane, for detecting a diffraction intensity in the recording of the diffraction image, and a mask holder which is displaceable in order to change between the portions of the lithography mask that are to be illuminated.

The advantages of the device described above correspond to those that have already been explained above with reference to the structure detection method. The device can be used as a measuring system for mask qualification or also as a registration tool.

In the coherent diffraction imaging (CDI) method, a zero order of diffraction can be used, and the lower orders of diffraction (e.g. +/−1st order) can also be substantially brighter than the other orders of diffraction. This can have the consequence that camera pixels of the spatially resolving detector, which measure the zero diffraction end, are overcontrolled. Alternatively or in addition, it can undesirably happen in this case that the camera pixels which measure the high orders of diffraction contain such little light (so few photons) that the signal-noise ratio is no longer sufficient for an exact structure detection or reconstruction.

This can be remedied by placing at least one absorber in the center of the detector (where the low orders of diffraction occur and/or where a high intensity of the diffraction image is to be expected locally on the detector). The absorber can either completely block the light or merely attenuate it (e.g., by a factor of 100 or 1000). If the absorber completely blocks the light, the algorithm of the structure detection method is configured such that the structure can nevertheless be reconstructed. This can be done by including an attenuating or blocking absorber or filter in the calculation of a reconstructed diffraction image in the context of the structure detection method. When an iterative Fourier transformation algorithm (IFTA) method is used, such an absorber or filter can be removed from the calculation after replacing an amplitude of the measured diffraction image with the root of the intensity.

If the absorber only attenuates the light, it is recommended to calibrate the attenuation, in particular to calibrate it in a position-dependent manner.

Alternatively or in addition, HDR (High Dynamic Range) methods can be used, which are known for example from digital photography. The same diffraction image is recorded several times with different exposure time or illumination intensity. In the image recorded with longer exposure time, the otherwise darker regions are well detected. In another recorded image with by comparison a shorter exposure time, the otherwise brighter regions are well detected. By suitable combination of 2, 3 or more images, it is possible to detect the bright regions and also the dark regions with a sufficient signal-noise ratio.

In some implementations, the device includes at least one coupling mirror for coupling the illumination light onto the illuminated portion of a reflecting lithography mask, in which the detector is arranged such that it receives the diffraction image of the illuminated portion in reflection, and the at least one coupling mirror simplifies guiding the illumination light in the measurement of a reflecting lithography mask.

In some implementations, the illumination light in the beam path before the coupling mirror runs between an object plane and the detector, in which a profile of the illumination light permits a compact structure of the device. The illumination light in the beam path before the coupling mirror can run parallel to the detection plane of the detector.

In some implementations, the coupling mirror is arranged in the beam path of the illumination light reflected by the illuminated portion, in which an arrangement of the coupling mirror has the effect that the lithography mask to be measured can be illuminated with perpendicular incidence. Undesired structure shadows can thereby be avoided. The same applies to an illumination light guiding in which the illumination light, before impinging on the illuminated portion, is guided between portions of a detection surface of the detector.

In some implementations, a tiltable mask holder allows different illumination directions to be preset, without having to make necessary changes to the coupling-in of the illumination light. It is thus possible to obtain directionally stable incidence of the illumination light.

In some implementations, the device can include a synchrotron-based light source or a high harmonic generation (HHG) light source, in which the light source can ensure illumination from exactly one illumination direction. The light source can be configured, for example, as arc lamp, laser (in particular excimer laser), synchrotron, HHG (High Harmonic Generation) or FEL (Free Electron Laser). Alternatively, other light sources in the EUV or DUV wavelength range are also possible. The structure detection of the lithography mask can take place with an illumination light wavelength corresponding to the wavelength likewise used in lithographic projection exposure of the lithography mask to produce semiconductor components. This is also referred to as actinic structure detection. However, this wavelength correspondence is not imperative, and therefore the structure detection method can also take place with a different illumination light wavelength than the projection exposure. A pellicle can be applied to the lithography mask in order to protect the lithography mask. The device can have an interferometric measuring system for measuring a position of the illuminated portion on the lithography mask. The device can have a structure generator for generating a structure of a beam of the illumination light. Such a structure can be chosen such that a distribution of an illumination intensity across the recorded illumination image is optimized in particular for the utilization of a dynamic range of the spatially resolving detector.

BRIEF DESCRIPTION OF DRAWINGS

Exemplary embodiments of the invention are explained in greater detail below with reference to the drawing. In said drawing.

DETAILED DESCRIPTION

Figure 1:
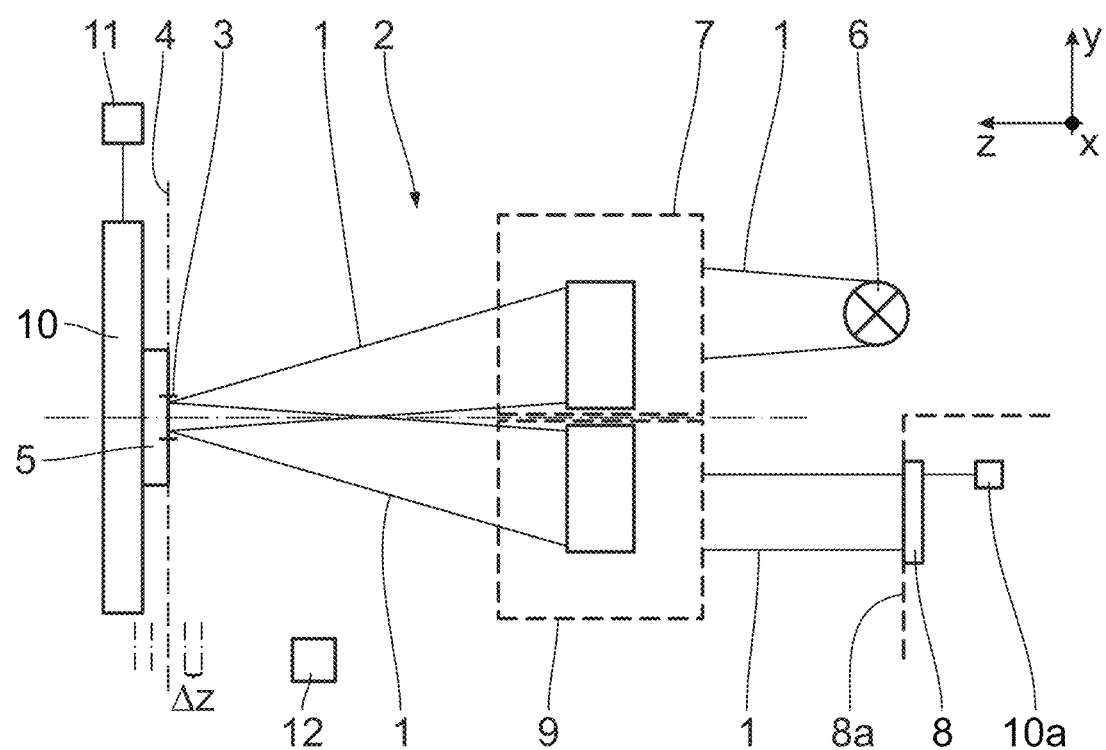
FIG. 1 is a highly schematic plan view, in a direction perpendicular to a plane of incidence, showing a measurement system for detecting a structure of a lithography mask by detection of at least one diffraction image, in order to measure a reflecting lithography mask.

FIG. 1 shows, in a view corresponding to a meridional section, a beam path of EUV illumination light or imaging light 1 in an example metrology system 2 for the examination of an object 5, arranged in an object field 3 in an object plane 4, in the form of a reticle or a lithography mask with the EUV illumination light 1.

The metrology system 2 is used to analyze a diffraction image and serves to detect a structure of the lithography mask, which in turn is used in EUV projection exposure to produce semiconductor components. The mask structure detected with the metrology system 2 can then be used, for example, to determine the effects of properties of the lithography mask on the optical imaging through projection optical units within a projection exposure system.

Like the system known from WO 2016/012426 A1, the metrology system 2 can be a system for mask qualification.

In this case, the structure of the lithography mask 5 to be detected is the mask structure itself that is to be imaged.

Alternatively or in addition, the structure of the lithography mask 5 that is to be detected can be a position marker or a useful structure on the lithography mask 5. The detection of such a position marker or useful structure can be used to detect and to measure an exact position of several position markers relative to one another or of several useful structures relative to one another or one or more useful structures relative to one or more position markers on the lithography mask 5. The metrology system 2 is used as a registration tool. A registration tool is known under the trade name PROVE. The measurement wavelength of the illumination light 1 may correspond to an actual projection exposure wavelength.

In order to facilitate the presentation of positional relationships, a Cartesian xyz-coordinate system is used hereinafter. In FIG. 1, the x-axis runs perpendicularly to the drawing plane. In FIG. 1, the y-axis runs upwards. In FIG. 1, the z-axis runs towards the left.

The object plane 4 lies parallel to the xy-plane.

The illumination light 1 is reflected and diffracted at the object 5. A plane of incidence of the illumination light 1 lies parallel to the y-z-plane.

Depending on the design of the metrology system 2, the latter can be used for a reflecting object 5 or also for a transmissive object 5. One example of a transmissive object is a phase mask.

The EUV illumination light 1 is generated by a light source 6. This can be a light source in the visible range, in the near, middle or far UV range or in the EUV range. The light source 6 may be a laser plasma source (LPP: laser produced plasma) or a discharge source (DPP: discharge produced plasma). A synchrotron-based light source can also be used, or a free electron laser (FEL). The light source 6 can have a means for high harmonic generation (HHG) of a basic wavelength. A useful wavelength of the EUV light source can lie, for example, in the range between 5 nm and 30 nm. However, longer or shorter wavelengths are also possible. In principle, in a variant of the metrology system 2, a light source for another useful wavelength can also be used instead of the light source 6, for example a light source for a DUV useful wavelength of 193 nm.

An illumination optical unit 7 of the metrology system 2 is arranged between the light source 6 and the object 5. The illumination optical unit 7 serves to illuminate the test object 5 with a defined illumination intensity distribution over the object field 3 and at the same time with a defined illumination angle or a defined illumination angle distribution with which the field points of the object field 3 are illuminated. With a lithography mask 5 arranged in the object field 3, the object field 3 at the same time represents an illuminated portion of the lithography mask 5.

After reflection on the object 5 or transmission through the object 5, the diffracted illumination or imaging light 1 impinges on a spatially resolving detection unit or detection device 8 of the metrology system 2. The detection device 8 is designed, for example, as a CCD detector or CMOS detector. A spatial resolution of the sensor or detector is obtained across a corresponding pixel distribution. The spatially resolving sensor of the detection device 8 can be delimited quadratically or rectangularly. The CCD or CMOS detector is arranged in a detection plane 8a. With the detection device 8, a diffraction intensity is detected during the recording of the diffraction image of the lithography mask 5. As is indicated in FIG. 1, a deflecting and/or beam-influencing optical unit 9 can be arranged between the object 5 and the detection device 8. This is not mandatory, however. Therefore, it is also possible for no optical element and/or no beam-influencing element at all to be arranged between the object 5 and the detection device 8.

The detection device 8 is in signal communication with a digital image-processing device 10a.

The object 5 is supported by a mask or object holder 10. The latter can be displaced by use of a displacement drive 11 on the one hand parallel to the xy-plane and on the other hand perpendicular to this plane, that is to say in the z-direction, e.g. in $\Delta_z$ increments. The mask holder 10 is displaceable for exchange between portions of the lithography mask 5 that are to be illuminated. The mask holder 10 can additionally be tiltable about the x-axis and/or about the y-axis. The displacement drive 11, and likewise the entire operation of the metrology system 2, is controlled by a central control device 12 which, in a manner not illustrated in more specific detail, is in signal communication with the components to be controlled.

Figure 2:
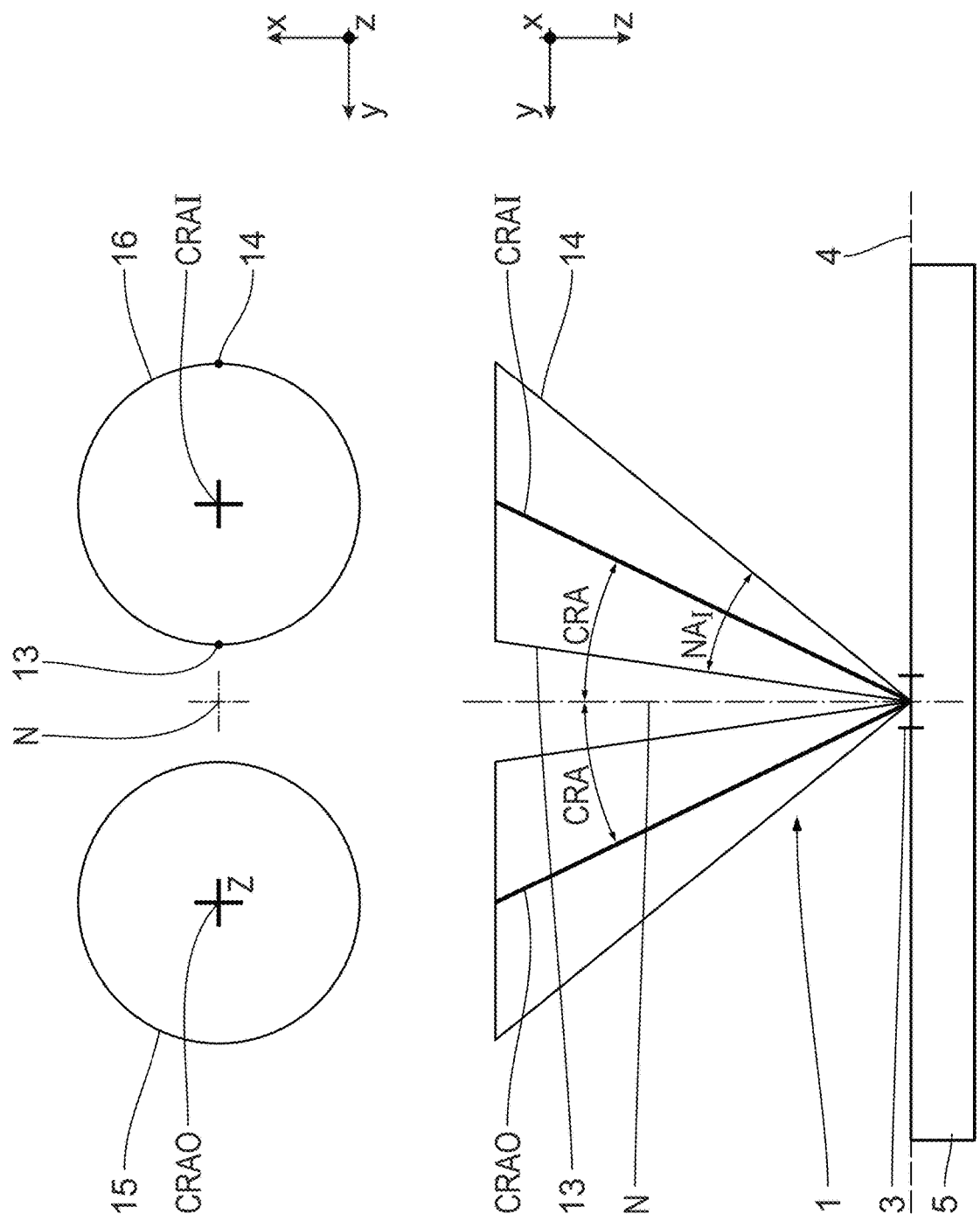
FIG. 2 shows schematic core parameters of an illumination and of a detection aperture within the measurement system according to FIG. 1.

FIG. 2 illustrates example aperture relationships on the one hand during the illumination of the lithography mask 5 with the illumination light 1 and on the other hand during the detection of the illumination light 1 diffracted by the lithography mask 5. The case of a reflecting lithography mask 5 is once again shown. As regards the numerical apertures or opening angles shown, the view according to FIG. 2 is not to scale.

The illumination light 1 impinges on the object field 3 with a chief ray angle CRA of 6° between an illumination-side chief ray CRAO and a normal N to the object plane 4. The object field 3 is obtained as an illumination spot of the illumination light 1.

Another chief ray angle CRA, particularly in the range of between 3° and 8°, is also possible. A zero order of diffraction of the illumination light 1 propagates starting from the object field 3 with an image-side chief ray angle between an image-side chief ray CRAI and the normal N, which again has the value of the incident-side chief ray angle CRA.

On the image side, the detection device 8, which is not shown in FIG. 2, has a detection angle between an inner marginal ray 13 closest to the normal N and an outer marginal ray 14 farthest from the normal N. For example, an angle between the inner marginal ray 13 and the normal N is 1.3° and, depending on the angle CRA, can lie in the range of between 0.1° and 6°. For example, an angle between the outer marginal ray 14 and the normal N is 10.7° and, depending on the angle CRA, can lie between 4° and 20°. For example, when using EUV wavelengths for the illumination, the angle between the outer marginal ray 14 and the normal N can lie between 8° and 16° and for example between 8° and 14°. When using a DUV wavelength, e.g. 193 nm, for the illumination, the angle between the outer marginal ray 14 and the normal N can be even greater and can also lie in the range of up to 20° or even greater, e.g. can be greater than 20°, greater than 30°, greater than 40°, or greater than 50°.

FIG. 2 shows, at the bottom, a yz meridional section in the region of the reflection of the illumination light 1 on the lithography mask 5. At the top left, FIG. 2 shows an illumination pupil 15, i.e. a distribution of the illumination angles over the object field 3, and on the right a detection pupil 16, i.e. a detection angle range of the illumination light 1 diffracted by the object field 3. The detection pupil 16 is not detected directly by the detection device 8, since a far field of a diffraction image is recorded in the detection plane 8a. Angles that are recorded by the detection device 8 are limited exclusively by a size of a sensor of the detection device 8. It is possible in principle to formulate the detection pupil 16 digitally, since it derives from data of the structure detection method described below.

Different illumination situations are to be distinguished. The object field 3 can, for example, be illuminated with exactly one defined illumination angle, for example precisely along the object-side chief ray CRAO. In this case, an illumination intensity is present in the illumination pupil 15 exclusively at the center Z thereof, at the intersection point of the object-side chief ray CRAO. Alternatively, it is possible to illuminate the object field 3 with a distribution of different illumination angles present within the illumination pupil 15. These different illumination angles can be used simultaneously or sequentially to the illumination of the object field 3.

The illumination pupil 15 and the detection pupil 16 are each limited circularly and have the same diameter. Alternatively, the boundary of the illumination pupil 15 and/or of the detection pupil 16 can deviate from a circular shape and can, for example, be elliptical. A greater main axis of the ellipse can extend along the x-direction or also along the y-direction. The illumination pupil 15 and the detection pupil 16 can be of different size.

For example, a numerical aperture $NA_I$, resulting from the detection pupil 16, of the detection of the illumination light diffracted by the object field 3 is 0.0825.

Depending on the configuration of the detection device 8, particularly through use of the interposed optical unit 9, this detection-side numerical aperture $NA_I$ can lie in the range between, e.g., 0.05 and 0.8. The detection-side numerical aperture $NA_I$ can, for example, lie in the range between 0.0625 and 0.21 for EUV illumination wavelengths, and it can also be greater when using DUV wavelengths, and can also be even greater than 0.8.

Figure 3:
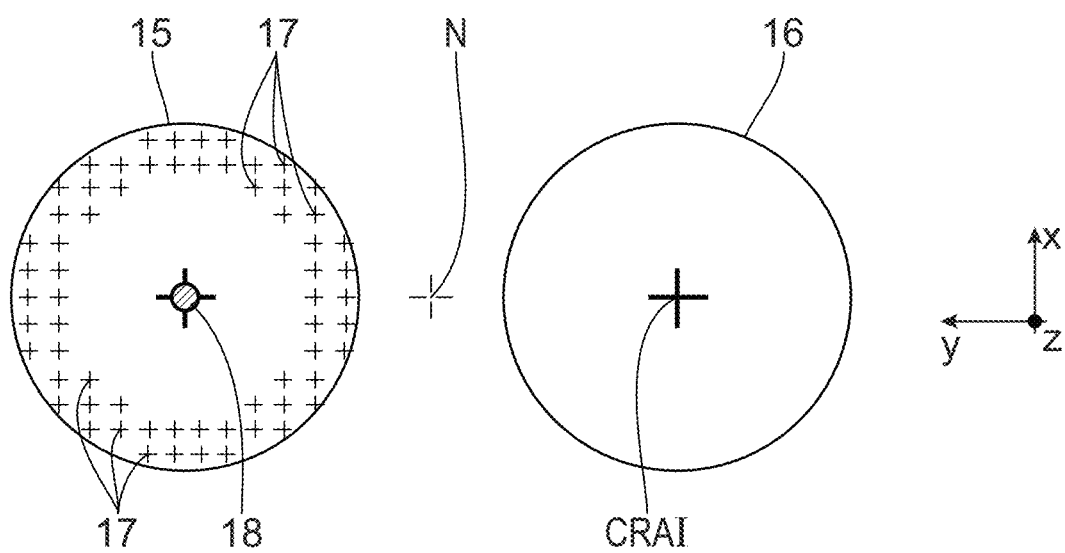
FIGS. 3 to 7 show embodiment variants of illumination geometries that can be used in the arrangement according to FIG. 2.

FIG. 3 shows at the top, in a view similar to FIG. 2, illumination and detection ratios in a variant of the structure detection of the lithography mask 5, which is otherwise not shown in FIG. 3.

FIG. 3 again shows the illumination pupil 15 and the detection pupil 16. The lithography mask 5 is illuminated with precisely one preferred illumination direction, namely in the direction of the object-side chief ray CRAO, which runs through the center of the illumination pupil 15. When using an EUV light source 6, such illumination with precisely one illumination direction can be achieved through use of a corresponding stop configuration or also through use of an EUV light source 6 with high beam brilliance, i.e. through use, for example, of a synchrotron-based light source 6. For use of a light source 6 with a long wavelength, it is possible to use a laser, for example.

In order to simulate, within the illumination pupil 15, illumination angles other than the central illumination angle of the object-side chief ray CRAO, the diffraction image detected with the detection device 8 can be displaced in the detection plane 8a in the digital image-processing device 10a, for example pixel by pixel in the x-direction and/or in the y-direction. Depending on the displacement of the detected diffraction image in the detection plane 8a, diffraction images are obtained which correspond to a correspondingly displaced, simulated illumination direction within the illumination pupil 15. When the diffraction image generated by the central pupil illumination shown in FIG. 3 is displaced in a regular x/y grid in the detection plane 8a, this corresponds to a simulated illumination of the object field 3 on the lithography mask 5 from illumination directions which, in FIG. 3, are indicated within the illumination pupil 15 as x/y grids of simulation illumination directions 17.

Such a displacement of the detected diffraction image for simulation of additional illumination angles is known in the literature as Hopkins approximation.

FIGS. 4 to 7 show illumination direction distributions, alternative to FIG. 3, which are shown correspondingly in the illumination pupil 15. Components and functions corresponding to those already explained above with reference to FIGS. 1 to 3, and in particular with reference to FIG. 3, bear the same reference numbers and are not discussed again in detail.

Figure 4:
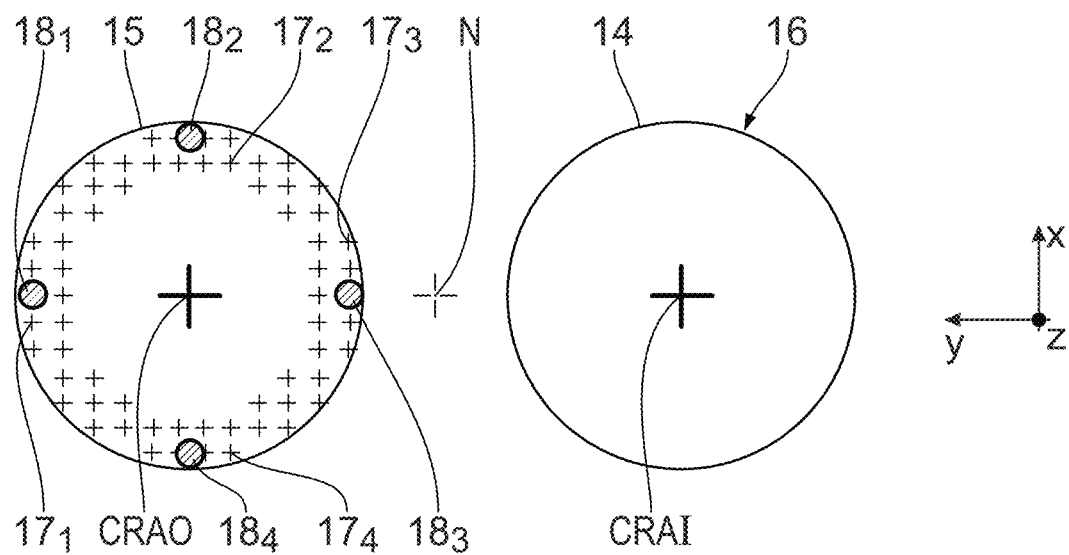

In the illumination of the object field 3 according to FIG. 4, the object field 3 is illuminated from four illumination directions $18_1$, $18_2$, $18_3$ and $18_4$ which are arranged in each case with identical edge distribution in the illumination pupil 15. As explained above in connection with FIG. 3, further illumination angles around these actually radiated illumination directions $18_1$ to $18_4$ can be simulated if the diffraction images, detected with the detection device 8, of the respective illumination directions $18_1$ to $18_4$ are again displaced in an x/y grid. This then results in the additional simulation illumination directions $17_1$ adjacent to the actually radiated illumination direction $18_1$, $17_2$ adjacent to the actually radiated illumination direction $18_2$, $17_3$ adjacent to the actually radiated illumination direction $18_3$, and $17_4$ adjacent to the actually radiated illumination direction $18_4$. In an illumination direction 17 to be simulated, it is first checked which of the actually radiated illumination directions $18_1$ to $18_4$ is closest to this illumination direction $17_i$ to be simulated, and, starting from this closest actually radiated illumination direction $18_i$, the desired simulation illumination direction $17_i$ is then simulated through corresponding displacement.

This region by region scanning of the simulation illumination directions $17_i$, in each case about the associated illumination directions $18_i$, is also known as non-Hopkins approximation.

These approximations are used in the simulation of an interaction of an object-field illumination with an object structure and the subsequent imaging in an aerial image. Simulation methods of this kind are described in the dissertation "Photolithography Simulation" by H. Kirchauer, Technical University of Vienna, Electronics Faculty, March 1998.

Figure 5:
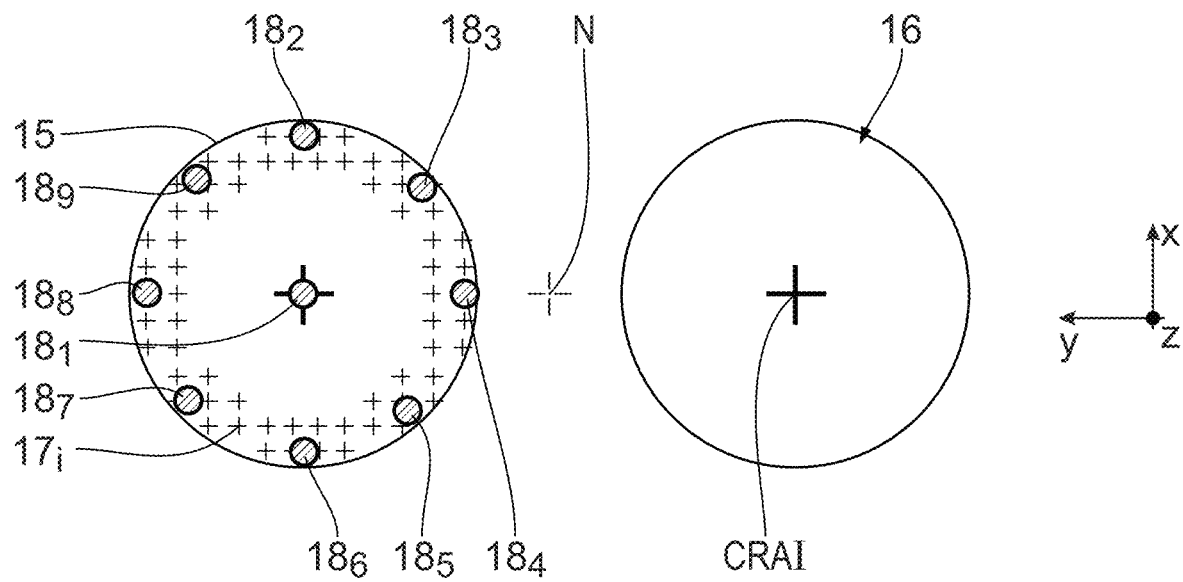

In the illumination variant according to FIG. 5, the illumination pupil 15 is illuminated with a total of nine different illumination directions $18_1$ (=CRAO) and illumination directions $18_2$ to $18_9$ arranged with identical distribution at the edge of the illumination pupil 15. The resolution is then correspondingly finer in the generation of the simulation illumination directions $17_i$, which takes place according to what has already been explained above.

Figure 6:
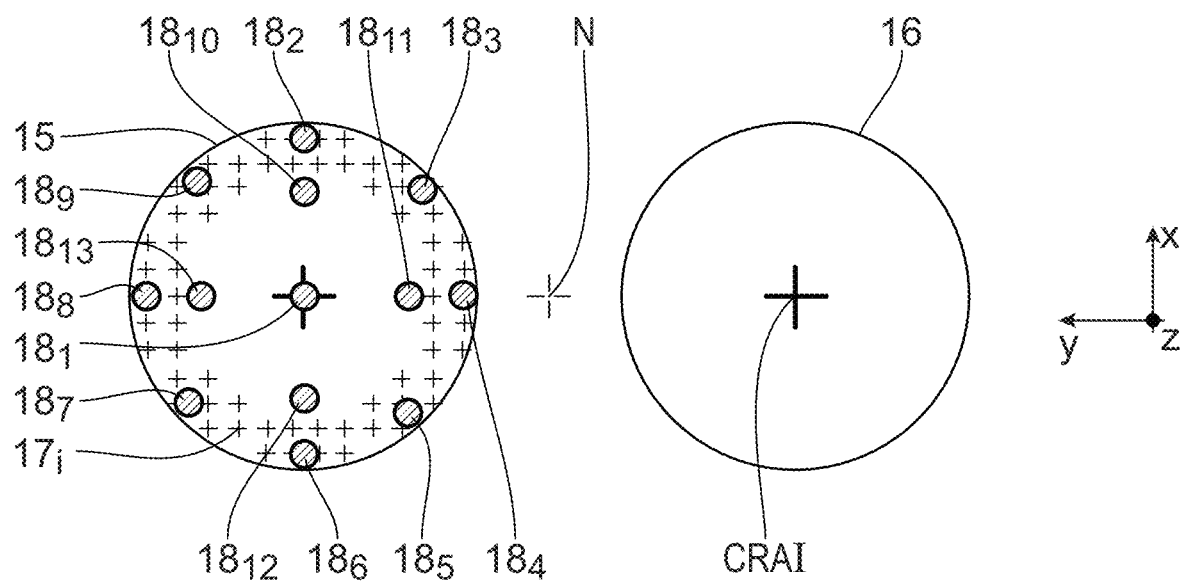
Figure 7:
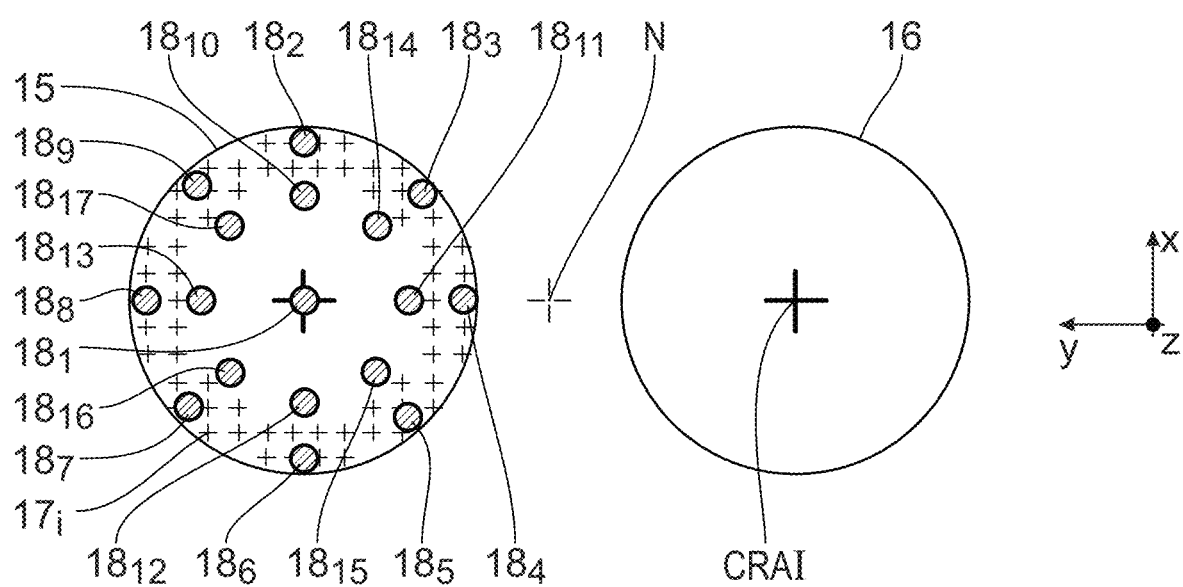

FIGS. 6 and 7 show still finer scanning of the illumination pupil 15 with actually radiated illumination directions $18_i$.

In the variant according to FIG. 6, in addition to the nine illumination directions according to FIG. 5, a further four actual illumination directions $18_{10}$, $18_{11}$, $18_{12}$ and $18_{13}$, again equally distributed, are present in a central radius of the illumination pupil 15.

In the illumination variant according to FIG. 7, in addition to these thirteen illumination directions according to FIG. 6, there are a further four illumination directions $18_{14}$ to $18_{17}$, which lie on the central radius of the illumination pupil 15 between in each case adjacent ones of the illumination directions $18_{10}$ to $18_{13}$, such that, in addition to the equally distributed eight outer illumination directions, there are eight correspondingly equally distributed illumination directions arranged on the central radius.

To predefine the simulation illumination directions $17_i$, an interpolation can also take place between the different actually radiated illumination directions $18_i$.

With the simulation illumination directions $17_i$, it is possible in particular to simulate an illumination setting actually used in the projection exposure. A simulated projection lithography illumination setting of this kind is, for example, an annular setting, a dipole setting or a multipole setting. A so-called conventional setting, in which an illumination pupil is homogeneously illuminated, can also be correspondingly simulated with the simulation illumination directions $17_i$. A setting in which only a portion of the illumination pupil is homogeneously illuminated, for example a central portion, is also possible. For example, a diameter of the central portion can be at most 10% or also at most 5% of the entire surface of the illumination pupil and can also be at most 1% or also at most 0.05% or at most 0.025%.

Moreover, the actually radiated illumination directions $18_i$ can be chosen such that illumination settings used in projection lithography can actually be simulated as effectively as possible. In a 0° quasar to be simulated, the actually radiated illumination directions $18_i$ can for example lie as illumination directions $18_1$ to $18_4$ in each case at the edge of the illumination pupil 15 at the angle positions 0°, 90°, 180° and 270°. Correspondingly, in a 45° quasar to be simulated, the four actually radiated illumination directions $18_1$ to $18_4$ can lie at the edge of the illumination pupil 15 at the angle positions 45°, 135°, 225° and 315°.

The different actual illumination directions $18_i$, explained above with reference to FIGS. 4 to 7, can be brought about by alteration of a corresponding coupling-in angle of a directed beam of the illumination light 1. Alternatively, it is possible to generate the illumination direction by corresponding tilting of the mask holder 10 and corresponding tracking of the detection device 8.

Figure 10:
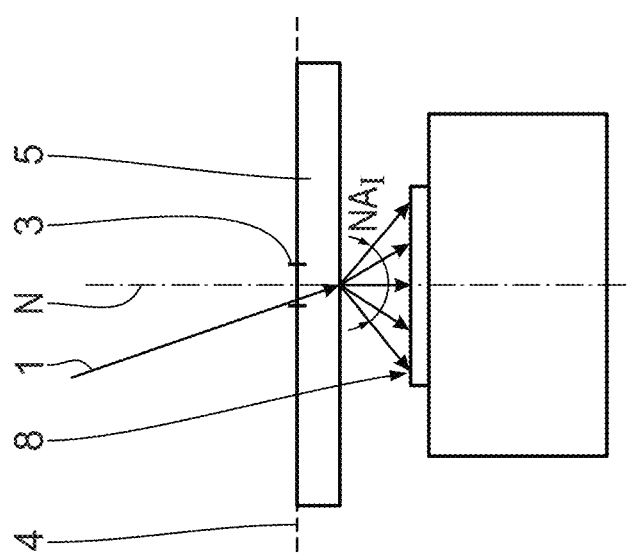
FIGS. 9 and 10 show the arrangement according to FIG. 8 at further illumination angles of the lithography mask.
Figure 9:
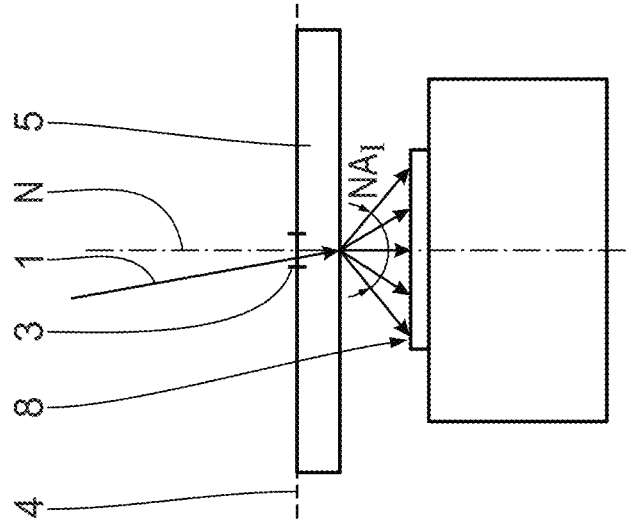
Figure 8:
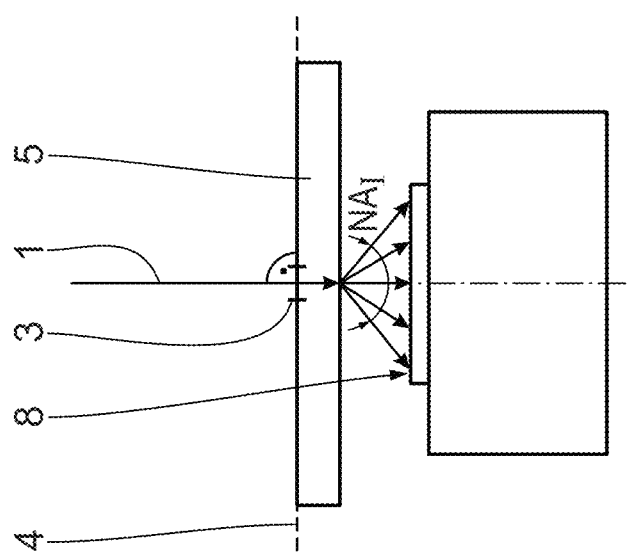
FIG. 8 shows a transmissive lithography mask and a detection unit in a further embodiment of the measurement system, at a first illumination angle of the lithography mask.

With reference to FIGS. 8 to 10, a further illumination variant is described which can be used in the metrology system 2. Components and functions corresponding to those already explained above with reference to FIGS. 1 to 7 bear the same reference numbers and are not discussed again in detail.

In the illumination according to FIGS. 8 to 10, a transmissive lithography mask 5 is used, for example a phase mask.

FIG. 8 shows the illumination situation in which a directed beam of the illumination light 1 impinges with perpendicular incidence on the object field 3 of the lithography mask 5. The generated diffraction image is recorded with the aid of the detection device 8 after the illumination light 1 has passed through the lithography mask 5 with the detection-side numerical aperture $NA_r$.

FIGS. 9 and 10 accordingly show the relationships for angles of incidence of the beam of the illumination light 1 which extend at an increasing inclination to the normal N to the object plane 4. Accordingly, the beam can also be inclined to the other side and/or in the direction from the drawing plane or to the drawing plane.

The different angles of incidence of the directed beam of the illumination light 1 onto the lithography mask can also be generated by corresponding tilting of the lithography mask 5 by use of the mask holder 10, wherein the detection device 8 can then be accordingly tracked.

Figure 11:
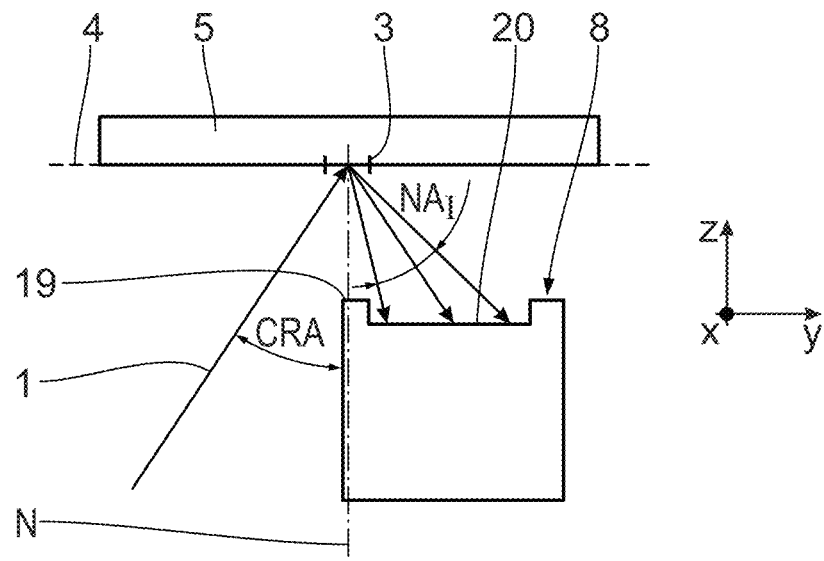
FIG. 11 shows a further embodiment of the illumination and of the detection unit in a further variant of the measurement system for measuring a reflecting lithography mask.

FIG. 11 shows, in a view similar to FIGS. 8 to 10, the relationships in the case of a reflecting lithography mask 5, this figure showing an arrangement variant for the detection device 8. Components and functions corresponding to those already explained above with reference to FIGS. 1 to 10 bear the same reference numbers and are not discussed again in detail.

The angle of incidence CRA of the directed incident beam of the illumination light 1 can for example lie in the range between 1.3° and 10.7° and can for example be 6°. At small angles of incidence CRA, an edge 19 of a sensor surface 20 of the detection device 8 directed towards the normal N is narrow and, for example, can have a y-extent which is less than 1 mm and which can be less than 0.5 mm.

Figure 12:
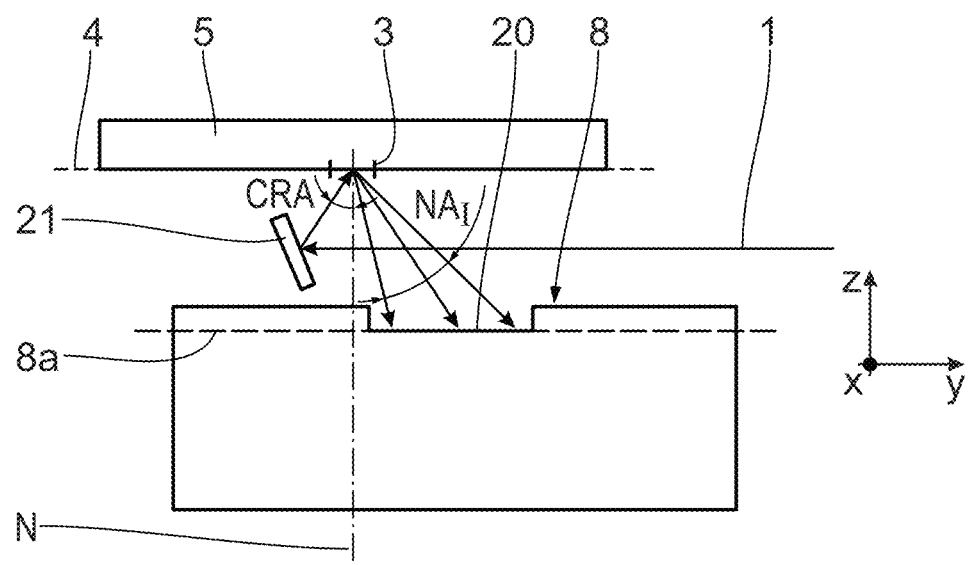
FIG. 12 shows, in a view similar to FIG. 11, a further embodiment of the illumination of the reflecting lithography mask and of the detection unit.

FIG. 12 shows, in an alternative to FIG. 11, radiation of the directed beam of the illumination light 1 onto the reflecting lithography mask 5. Components and functions corresponding to those already explained above with reference to FIGS. 1 to 10, and in particular with reference to FIG. 11, bear the same reference numbers and are not discussed again in detail.

A coupling mirror 21 is arranged in the light path of the illumination light 1 before the object field 3. The coupling mirror 21 serves to couple the illumination light 1 onto the object field 3, i.e. onto the illuminated portion of the lithography mask 5. The sensor surface 20 of the detection device 8 is arranged such that it receives the diffraction image of the object field 3 in reflection.

In the beam path before the coupling mirror 21, the illumination light runs between the lithography mask 5 and the sensor surface 20 of the detection device 8. Before reflection at the coupling mirror 21, the beam of the illumination light 1 runs parallel to the xy-plane, i.e. parallel both to the object plane 4 and to the detection plane 8a.

A further variant of the illumination of a reflecting lithography mask 5 is explained below with reference to FIG. 13. Components and functions corresponding to those already explained above with reference to FIGS. 1 to 12, and in particular with reference to FIGS. 11 and 12, bear the same reference numbers and are not discussed again in detail.

Figure 13:
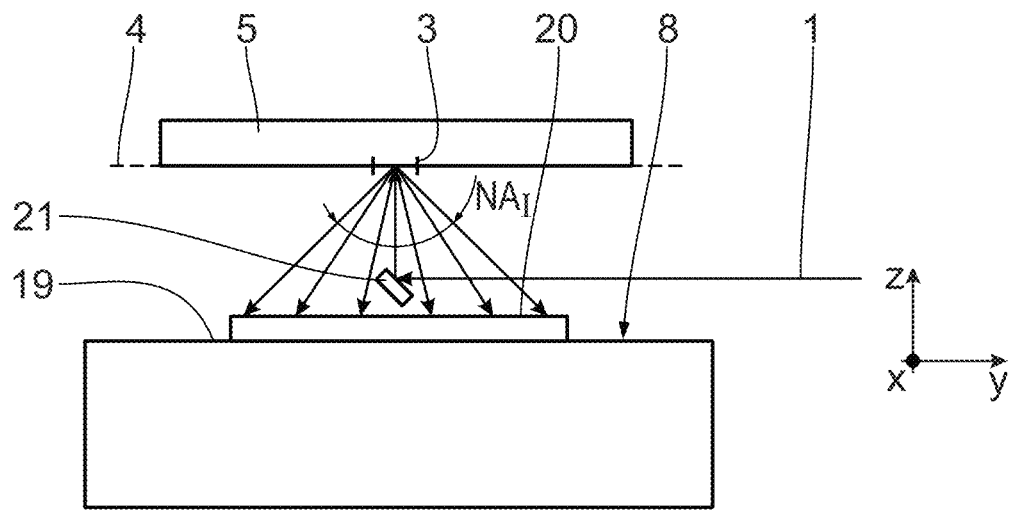
FIG. 13 shows, in a view similar to FIGS. 11 and 12, a further embodiment of an illumination of the reflecting lithography mask and of the detection unit.

In the illumination variant according to FIG. 13, the coupling mirror 21 is arranged in the beam path of the illumination light 1 diffracted from the object field 3 to the sensor surface 20 of the detection device 8. In this arrangement, the coupling mirror 21 thus lies in the detection-side numerical aperture $NA_f$.

A further variant of the illumination of a reflecting lithography mask 5 is explained below with reference to FIG. 14. Components and functions corresponding to those already explained above with reference to FIGS. 1 to 12, and in particular with reference to FIGS. 11 to 13, bear the same reference numbers and are not discussed again in detail.

Figure 14:
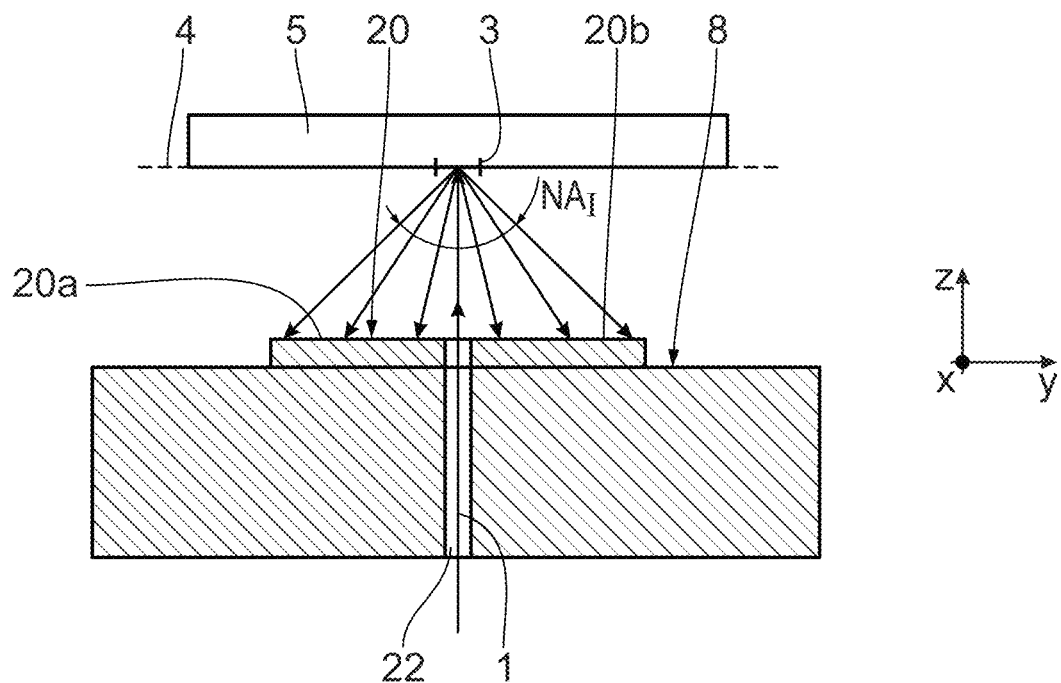
FIG. 14 shows, in a view similar to FIGS. 11 and 12, a further embodiment of an illumination of the reflecting lithography mask and of the detection unit.

In the illumination variant according to FIG. 14, the directed beam of the illumination light 1 is guided through the detection device 8 and then radiated without further deflection onto the object field 3. The illumination light 1, before impinging on the object field 3, is guided between portions 20a, 20b of the sensor surface 20 of the detection device 8. Here, the sensor surface 20 can be monolithic, and the guiding of the radiated illumination light 1 through the detection device 8 can take place through a corresponding guide channel 22 which is configured in the detection device 8 and opens out on the sensor surface 20. Alternatively, the sensor of the detection device 8 can be configured with a multi-part sensor surface 20a, 20b, in which case the radiated illumination light 1 is guided through between these portions of the sensor surface.

The measurement with the aid of the metrology system 2 can take place through a pellicle that protects the lithography mask 5.

Figure 15:
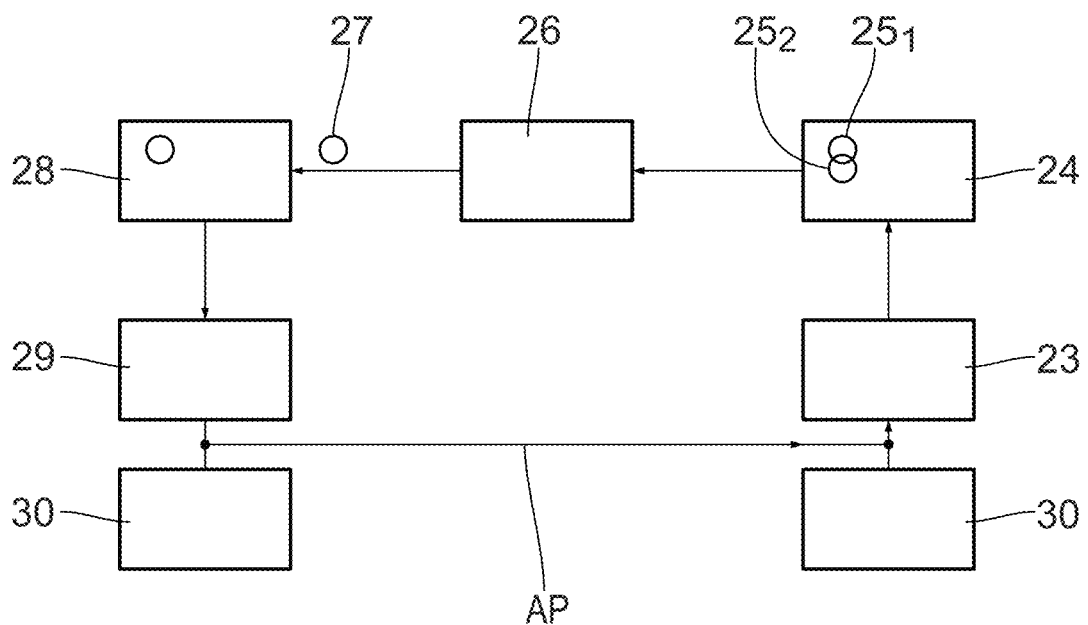
FIG. 15 shows a flow diagram of an iterative Fourier transformation algorithm which can be used in calculating a portion structure of the lithography mask in an illuminated portion from a recorded diffraction image in the measurement carried out by the measurement system.

A method for detecting a structure of the lithography mask 5 is described below with reference to FIG. 15. FIG. 15 shows the principal steps in the execution of an example iterative Fourier transformation algorithm (IFTA).

In a first step, a portion of the lithography mask 5, namely the portion coincident with the object field 3, is illuminated with the illumination light 1 of the light source 6 with a defined illumination direction or a defined illumination direction distribution, as has been explained above with reference to FIGS. 2 to 14.

With the aid of the detection device 8, a diffraction image 23 of the illuminated portion is recorded in the detection plane 8a by spatially resolved detection of a diffraction intensity of the illumination light 1 diffracted by the illuminated portion of the lithography mask 5.

Far-field imaging in particular can take place with the aid of the optical unit 9. To present the diffraction image 23, the optical unit 9 can thus generate an image of the imaging pupil. The optical unit 9 can be configured as at least one Bertrand lens or at least one Bertrand mirror. However, the optical unit can also be simply omitted, and the far-field imaging can be realized by a certain spacing between the illuminated lithography mask and the sensor.

The illumination of the lithography mask 5 is then carried out for further portions of the lithography mask 5. For this purpose, the lithography mask 5 is displaced relative to the illumination spot of the illumination light 1 in the xy-plane, which is effected with the aid of the mask holder 10. This therefore results in a corresponding relative displacement of the object field 3 on the lithography mask 5. Adjacent illuminated portions on the lithography mask 5 overlap each other in each case in an overlap region. A surface extent of this overlap region is at least 5% of the smaller of the two illuminated portions of the lithography mask 5. If, as in the exemplary embodiment described, the illuminated portions are each the same size and have the extent of the object field 3, the overlap region is at least 5% of the surface area of the object field 3. In variants of the structure detection method, the overlap region can be at least 10%, at least 20%, at least 30%, at least 40%, at least 50%, at least 60%, at least 70%, at least 80% or also at least 90% of the surface area of the object field 3.

The structure of the lithography mask 5 can be reconstructed from the recorded diffraction images by an iterative method. For this purpose, an approximation for the structure of the lithography mask is firstly assumed (this may be poor, e.g. a constant structure). This approximation is illuminated in a portion with the aid of a simulation and the diffraction image is calculated. The simulation of the illumination corresponds here to the illumination actually carried out previously. In a simple case, the calculation of the diffraction image can be carried out by a Fourier transformation of the portion by portion illuminated approximation. The calculated diffraction image consists of amplitude information and phase information. The amplitude is replaced by the root of the measured diffraction image (the illuminated portion of the lithography mask) and the phase is maintained. By an inverse Fourier transformation (or back-simulation), a new estimation of the structure of the lithography mask is obtained.

This estimation 24 extends across the entire surface of the lithography mask 5, wherein only a portion or a portion structure 25 of this estimation corresponds to the illuminated portion or the illuminated portion structure. Only in this region is the initially assumed approximation for the structure of the lithography mask updated in amplitude and phase by the newly obtained estimation. This newly obtained estimation is now illuminated in another portion and the procedure just described is repeated, such that gradually all of the measured diffraction images contribute to an overall approximation 26 of the structure of the lithography mask. It is usually necessary that, in an iterative method, the described procedure is effected several times on each illuminated portion, since the overall estimation of the structure of the lithography mask still changes and therefore the simulated diffraction images also change in amplitude and phase. In the method described, the phase cannot be corrected directly by a measurement but instead gradually adjusts to the correct value.

The overall approximation 26 consists of "amplitude/phase" value pairs for all of the calculated portion structures $25_i$ at the respective x, y position coordinates which are assigned to the lithography mask 5. The amplitude value corresponds here to the square root of the intensity of the light in the band-limited near field of the lithography mask. The phase value corresponds here to the phase of the light in the band-limited near field of the lithography mask 5. Structure information of the lithography mask 5 derives from these values.

This scanning of the whole lithography mask 5 with illuminated portions takes place until the detected portion structures $25_i$, $25_{i+1}$, $25_{i+2}$, etc. completely cover an entire region of the lithography mask 5 to be detected. With the aid of a digital spatial stop 27, a spatial region 28 in the position space of the overall approximation 26 is now selected from the overall approximation 26. The x, y coordinates of this spatial region 28 can for example correspond to those of an originally illuminated portion 25 of the lithography mask 5.

The region selection of the overall approximation 26 effected through use of the digital spatial stop 27, i.e. the amplitude/phase data in the spatial region 28, are now Fourier-transformed, resulting in an amplitude distribution 29 and a phase distribution 30 in the frequency space of the diffraction image.

In an adaptation step AP, the amplitude distribution 29, resulting from the Fourier transformation, is now replaced by the actual measurement result, i.e. by the measured amplitude distribution of the diffraction image 23. The phase distribution 30 remains unchanged. With this new distribution pair, i.e. the diffraction image 23 (amplitude distribution) and the phase distribution 30 arising in the first iteration step, the inverse Fourier transformation is again carried out for the various illuminated portions $25i$ and the resulting spatial regions 28. This is repeated until the overall approximation 26, i.e. the region of the lithography mask 5 to be detected, converges, that is to say does not change by more than a predefined tolerance value. The structure of the lithography mask 5 thus resulting from the converging overall approximation 26 is the result of the detection method.

The object structure $25i$ of the respective portion is calculated, and the overall approximation 26 obtained, using a method of coherent diffraction imaging (CDI). Such a method is known from the specialist article "High numerical aperture reflection mode coherent diffraction microscopy using off-axis apertured illumination" by D. F. Gardner et al., Optics Express, vol. 20, no. 17, 2012.

Basic principles of the iterative Fourier transformation algorithm (IFTA) are found in the specialist article "Further improvements to the ptychographical iterative engine" by A. Maiden et al., OPTICA, vol. 4, no. 7, 2017 and "Movable Aperture Lensless Transmission Microscopy: A Novel Phase Retrieval Algorithm" by H. M. L. Faulkner et al., for RevLett, vol. 93, no. 2, 2004.

A further reference to the use of a diffraction image recording in structure detection is the specialist article "Full field tabletop EUV coherent diffractive imaging in a transmission geometry" by B. Zhang et al., Optics Express, vol. 21, no. 19, 2013.

Figure 16:
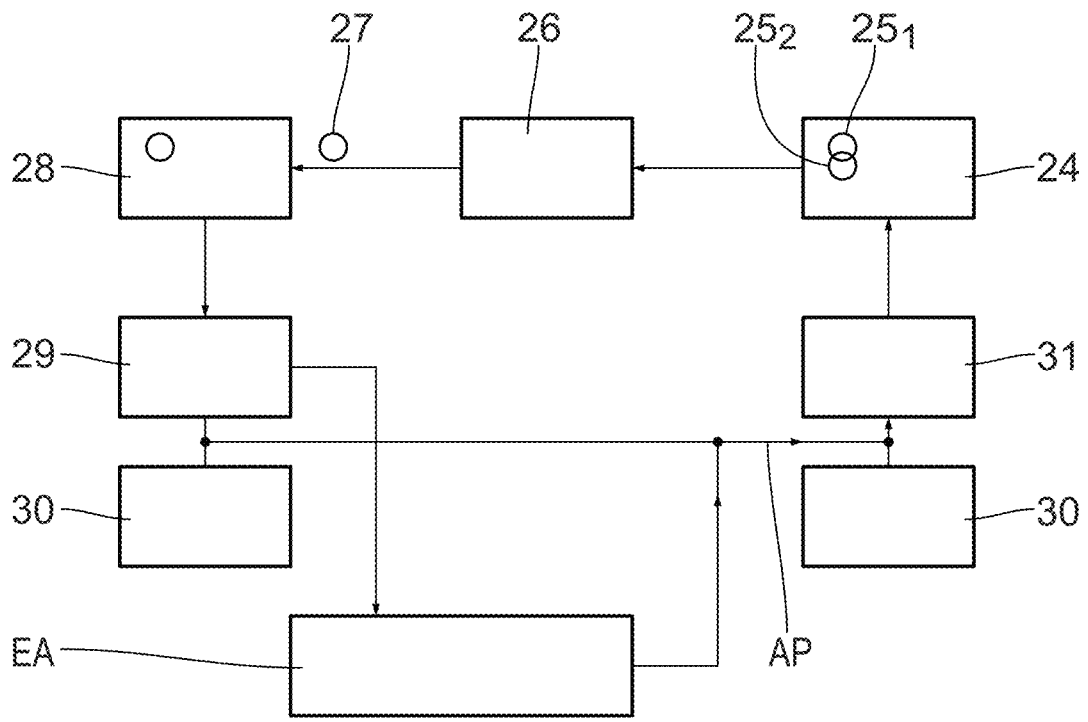
FIG. 16 shows, in a view similar to FIG. 15, a variant of the iterative Fourier transformation algorithm according to FIG. 15, additionally taking into account a coherence length of a light source of the measurement system for providing illumination light.

An extended algorithm, used in an alternative structure detection method, is described below with reference to FIG. 16. Components, functions and method steps corresponding to those already explained above with reference to FIG. 15, bear the same reference numbers and are not discussed again in detail.

In the adaptation step, the amplitude distribution A_1(x,y) of the actually obtained object (approximations 24 and 26) is replaced, using the originally measured diffraction image 23, by an adapted amplitude distribution A(x,y) 31, wherein the following applies for each pixel:

$$A(x,y)=Q(x,y)\cdot A\_1(x,y)$$

The phase distribution of the actually obtained object remains unchanged in this step and is $$Q=\sqrt{I_0/I_S}$$

I0(x,y) is the measured intensity on the sensor (diffraction image) and Is(x,y) is the intensity simulated on the sensor from the actually obtained object (simulated diffraction image).

In the example of a Köhler illumination within the Hopkin's approximation, the simulated intensity can be determined, for example, by a convolution of $I\_1(x,y)=|A\_1(x,y)|^2$ with the illumination setting of the illumination of the lithography mask 5.

When changing between the illuminated portions $25_i$ on the lithography mask 5, a relative displacement of the illumination spot of the illumination light 1 onto the lithography mask 5 in the x-direction and y-direction needs to be known very precisely. Position inaccuracies can arise here on account of tolerances of the object holder 10 or on account of an inexact interferometric measurement of the position of the object holder 10. The above reconstruction algorithm can be extended such that it estimates actual physical positions of the lithography mask 5 from predefined positions and, from these, supplies information for improved position determination of the lithography mask 5. This position estimation method is known from the specialist article "Translation position determination in ptychographic coherent diffraction imaging" by F. Zhang et al., Optics Express, vol. 21, no. 11, 2013.

Alternatively or in addition, the structure detection methods described above can be extended such that the object field 3 on the lithography mask 5 is illuminated in a structured manner, i.e. with a defined structured intensity distribution. An intensity distribution of the diffraction image 23 can be influenced in this way.

In contrast to a for example likewise possible homogeneous illumination of the object field 3, periodic structures of the lithography mask 5 in the object field 3, for example, when using a structured illumination, have a greater number of constructive interferences and thus a greater number of diffraction maxima. By contrast, in a homogeneous illumination, correspondingly periodic structures have only comparatively few orders of diffraction on the sensor surface of the detection device 8.

The structured illumination can be predefined as a Gaussian or sinc function of the intensity distribution over the object field 3. An improved distribution of diffraction maxima on the sensor surface of the detection device 8 is obtained, which reduces dynamic demands on the sensor.

Moreover, by using a corresponding structured illumination, a sensitivity of the structure detection to a deviation of the structure of the lithography mask 5 from a predefined periodicity can be increased.

The optionally structured illumination distribution in the object plane 4 has to be well known in amplitude and phase and can in particular be used in the reconstruction algorithm. For example, the actually obtained object can be multiplied by this structured illumination distribution (or an adapted factor that takes account of this distribution) before the amplitude distribution 29 and phase distribution 30 are determined with a Fourier transformation step. After replacement of the amplitude by the root of the diffraction image measured with this structured illumination, a back calculation to the object plane is made, for example, in a renewed Fourier transformation step. Here, the factor multiplied above can be reversed by a suitable computing operation (e.g. division with regularization), such that the actually obtained object can be updated in part. Alternatively or in addition, the structured illumination can also take place by calibration of the detection method with the aid of a reference object with exactly known structures. Information regarding corresponding detail steps of the algorithm is found in the aforementioned specialist article "Further improvements to the ptychographical iterative engine" by A. Maiden et al.

In the event that a structure of the illumination of the object field 3 is not sufficiently well known, i.e. also in the event of, for example, undesired deviations from a desired homogeneity of the illumination over the object field or from a desired structure of the distribution of phase and amplitude of the illumination, an illumination spot, i.e. a distribution of phase and amplitude of the illumination over the object field, can be estimated within the structure detection method. For this purpose, within the structure detection method explained above, a person skilled in the art can use extensions to an algorithm which is described in the aforementioned specialist article "Further improvements to the ptychographical iterative engine" by A. Maiden et al.

The result of the structure detection method is a converging overall structure, starting from the overall approximation 26, which is determined as described above in an iterative method. This overall structure is obtained on the basis of the diffraction image recordings which are regularly effected with the aid of a pixel-based sensor of the detection device 8. Correspondingly, the structure detection method can be based on a pixelated estimation of the object, i.e. of the lithography mask structure to be detected. A prerequisite for this is that a position of the illumination spot relative to the lithography mask 5 is very well known, i.e. the position of the object field 3 relative to the overall lithography mask 5. A required accuracy in the measurement of the relative positioning of the lithography mask 5 when changing between the illuminated portions can lie in the range of between 0.01 nm and 10 nm, particularly in the range of between 1 nm and 10 nm. The required accuracy in the relative positioning can be less.

In the case where the reconstruction algorithm is based on a pixelated estimation of the object or of the lithography structure to be detected, the following problem arises. The illuminated fraction is determined from the pixelated object. If the relative position of illumination and object or the relative displacement between two illuminated fractions does not correspond to a whole-number multiple of the pixel size with which the pixelated object is described, then the determination of the illuminated fraction cannot be effected by a selection of defined pixels. The required accuracy in the position determination may make it necessary that the relative positions of illumination and object or the relative displacements between two illuminated fractions have to be described more precisely than with a multiple of the pixel size. Although the pixel size can in principle be chosen freely, the maximum computing time, for example, or the maximum available storage space can define a minimum possible pixel size. The pixels described in this connection are not pixels of a sensor of the detection device 8, but pixels of a pixelated description of the object to be reconstructed, i.e. the lithography mask 5.

In a first method for reducing such reconstruction errors, a position of the lithography mask 5 is described more precisely than is necessary on account of the pixel raster of the sensor surface. This can be done, on the one hand, by a fitting algorithm in which the object is displaced computationally by a fraction of a displacement about a whole pixel and the results of such a subpixel displacement are compared to one another. Alternatively or in addition, a displacement of the lithography mask 5 for generating the different portions $25_i$ to be scanned can be divided into a whole-number pixel shift and an additional subpixel shift. Again alternatively or in addition, a corresponding subpixel shift can be kept available for the description of the position of the illumination spot. Since the illumination spot generally has a simpler quality or also a more precisely known quality than the lithography structure to be determined, a simpler interpolation is possible in the displacement of the illumination spot. A set of calculation results in performing the algorithm described above for example with reference to FIGS. 15 and 16 can then be kept available for corresponding subpixel-displaced illumination spots.

The subpixel shift can be generated by an interpolation or a displacement in the position space of the object, i.e. of the lithography mask 5, and/or by conferring a phase tilt in the frequency space of the diffraction image 23.

The shift-tilt theorem of the Fourier transformation states that a displacement of the function to be transformed leads to a phase tilt in the transformed function. If this relationship no longer applies and a displacement also causes amplitude effects, artefacts may occur in the iterative reconstruction algorithm.

A potential violation of the shift-tilt theorem in the discrete Fourier transformation can be alleviated by use of filters. For example, in the method described above using an iterative Fourier transformation algorithm, in the transition between the amplitude distribution 29 and phase distribution 30 determined in one step, it is possible for only part of the respective new information to be used in order to improve a current object estimation.

Details of the inclusion of the subpixel shift in the structure detection algorithm are found in the specialist article "Superresolution imaging via ptychography" by A. Maiden et al., JOSAA, vol. 28, no. 4, 2011.

Instead of a Fourier transformation, a two-dimensional convolution can also be used in the above-described structure detection methods. This can be helpful in particular for the treatment of the above-described subpixel shift.

For the treatment in particular of the subpixel shift described above in connection with the structure detection methods, it may be possible not to use any Fourier transformation and to replace this with two-dimensional (2D) convolutions. The occurrence of artefacts through a violation of the shift-tilt theorem can then be avoided.

The amplitude distribution 29 and the phase distribution 30, $S_i(p)$, can be written as follows pixel by pixel for a given position of the object field 3 on the lithography mask 5, i.e.

for a given position of the illuminated portion, as a function of the illumination intensity distribution over the object field, I(x), and for a given estimation or approximation of the object structure in the spatial region 28 as a convolution:

$$S_i(p) = \int d^2k e^{iak} \hat{T}(k) \hat{I}(p-k) \quad (1)$$

p and k here are the coordinates in the frequency space, i.e. in the Fourier space. In a discrete interpretation, p can be interpreted as sensor pixel.

a stands for the position of the spatial region 28 on the whole lithography mask 5. $\hat{T}(k)$ is the Fourier transform of the object structure T(x).

$\hat{I}$ is the Fourier transform of the illumination intensity distribution. Therefore, a convolution of the Fourier transform of the displaced object structure with the Fourier transform of the mask illumination takes place at each pixel of the sensor surface.

By further convolution with an inverse illumination intensity distribution $I^{-1}(x)$, starting from the mean amplitude and phase values at the sensor surface obtained from the above equation, one proceeds to the next iteration step for the object spectrum $\hat{T}(k)$ in the Fourier space, from which the approximation 24 can then in turn be determined. This gives:

$$\int d^2x e^{ixk} I(x) I^{-1}(x) = \delta(k) \quad (2)$$

and $$\hat{T}(k) = \int d^2p e^{iap} \hat{S}a(p) \hat{I}^{-1}(k-p) \quad (3)$$

The object structure T(x) can be determined by an inverse Fourier transformation from the object spectrum $\hat{T}(k)$.

The intensity of the diffraction image is then obtained as the absolute square value of the above equation (1).

$$I_a(p) = |\int d^2k e^{iak} \hat{T}(k) \hat{I}(p-k)|^2 \quad (4)$$

Figure 17:
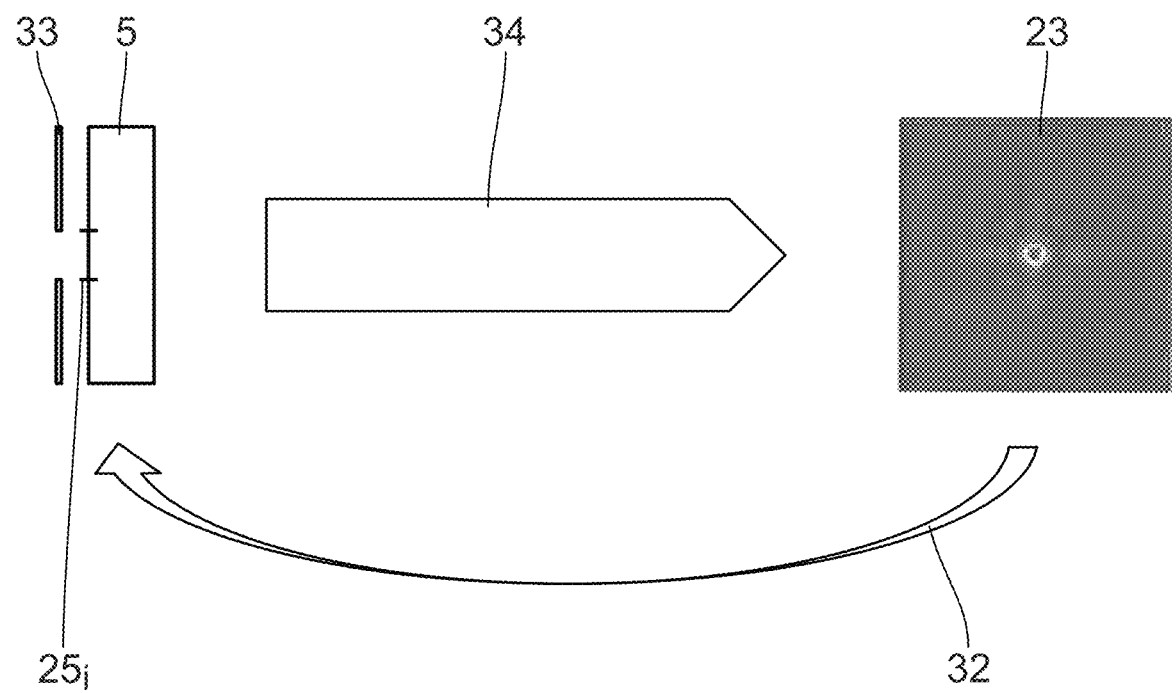
FIG. 17 shows a flow diagram of an alternative evaluation method for structure detection on the basis of a recorded diffraction image, in which a convolution is used instead of a Fourier transformation.

With reference to FIG. 17, an alternative iterative structure detection method is described which can be used as an alternative or in addition to the methods described above. Components and functions already explained above in particular with reference to FIGS. 15 and 16 bear the same reference numbers and are not discussed again in detail.

The recorded diffraction image 23 is optimized in a pixel-based manner with the aid of a back propagation step (cf. the specialist article "General framework for quantitative three-dimensional reconstruction from arbitrary detection geometries in TEM," Wouter Van den Broek and Christoph T. Koch, Phys Rev. B 87 (2013) 184108). For this purpose, in a step 32, the approximation 24 of the object, i.e. of the lithography mask 5, in an illuminated portion, indicated in FIG. 17 by an illumination stop 33, is again inferred, and this is in turn done for a plurality of overlapping portions of the lithography mask 5. From this, in the next step, it is then possible, using the above equation (4), to again calculate a candidate intensity distribution of the diffraction image 23, which is compared to the actual diffraction image 23. This method too can then be carried out iteratively until a converging result is obtained for the structure of the lithography mask 5.

Alternatively, the diffraction image on the sensor surface of the detection device 8 can be written as follows with the aid of a Fourier transformation:

$$I_a(p) = |\int d^2x e^{-ixp} T(x) I(x-a)|^2$$

This is done in a simulation step 34.

A reconstruction of the object to be estimated, i.e. the approximation 24 and the overall approximation 26, does not have to be defined on a pixel raster and instead can be defined with the aid of polygons or vector graphics. This can help to avoid interpolation problems. The parameters of the polygons or vector graphics can be determined, for example, by optimization or estimation, e.g. Kalman filtering.

Here, it is possible to use algorithms which are known for example from the aforementioned dissertation "Photolithography Simulation."

The features described above related to processing of data can be implemented by, e.g., the digital image processing device 10a, or be implemented in digital electronic circuitry, or in computer hardware, firmware, software, or in combinations of them. The features related to processing of data includes, e.g., calculating the structure of the lithography mask from the recorded diffraction images of the illuminated portions, ptychography, a non-Hopkins approximation, Fourier transformation, and iterative Fourier transformation. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the digital imaging processing device 10a can be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for detecting the structure of a lithography mask described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a flash memory drive, a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A method for detecting a structure of a lithography mask, comprising the following steps:
    illuminating a portion of the lithography mask with illumination light of an at least partially coherent light source in at least one predetermined illumination direction,
    recording a diffraction image of the illuminated portion by spatially resolved detection of a diffraction intensity of the illumination light diffracted from the illuminated portion in a detection plane,
    repeating the "illuminating" and "recording" steps for further portions of the lithography mask, wherein between at least two portions of the lithography mask that are thereby detected there is in each case an overlap region whose surface extent measures at least 5% of the smaller of the two portions, until the detected portions completely cover a region of the lithography mask to be detected, and
    calculating the structure of the lithography mask from the recorded diffraction images of the illuminated portions, wherein the illuminated portion is illuminated with several predetermined illumination directions, wherein the diffraction image of the portion illuminated with these several predetermined illumination directions is in each case recorded.

2. The method of claim 1, wherein the calculation of the structure of the lithography mask takes place using a method of coherent diffraction imaging (CDI) or ptychography.

3. The method of claim 2, comprising using a non-Hopkins approximation.

4. The method of claim 2, comprising using a Fourier transformation in the calculation of the structure of the lithography mask from the recorded diffraction images.

5. The method of claim 2, comprising taking into consideration a degree of coherence of the light source in the calculation of the structure of the lithography mask from the recorded diffraction images.

6. The method of claim 2, comprising using measured positions of the illuminated portions on the lithography mask in the calculation of the structure of the lithography mask from the recorded diffraction images.

7. A device for carrying out a method of claim 2, the device comprising:
    a light source for providing the illumination light;
    a spatially resolving detector, arranged in the detection plane, for detecting a diffraction intensity in the recording of the diffraction image; and
    a mask holder which is displaceable in order to change between the portions of the lithography mask that are to be illuminated.

8. The method of claim 1, comprising the use of a non-Hopkins approximation.

9. The method of claim 1, wherein a Fourier transformation is used in the calculation of the structure of the lithography mask from the recorded diffraction images.

10. The method of claim 9, wherein an iterative Fourier transformation algorithm (IFTA) is used in the calculation of the structure of the lithography mask from the recorded diffraction images.

11. The method of claim 1, wherein a degree of coherence of the light source is taken into consideration in the calculation of the structure of the lithography mask from the recorded diffraction images.

12. The method of claim 1, wherein measured positions of the illuminated portions on the lithography mask are used in the calculation.

13. The method of claim 1, wherein the measurement takes place through a pellicle.

14. A device for carrying out a method of claim 1, the device comprising:
    a light source for providing the illumination light,
    a spatially resolving detector, arranged in the detection plane, for detecting a diffraction intensity in the recording of the diffraction image, and
    a mask holder which is displaceable in order to change between the portions of the lithography mask that are to be illuminated.

15. The device of claim 14, comprising at least one coupling mirror for coupling the illumination light onto the illuminated portion of a reflecting lithography mask, wherein the detector is arranged such that it receives the diffraction image of the illuminated portion in reflection.

16. The device of claim 15, wherein the illumination light in the beam path before the coupling mirror runs between an object plane and the detector.

17. The device of claim 15, wherein the coupling mirror is arranged in the beam path of the illumination light reflected by the illuminated portion.

18. The device of claim 14, wherein the illumination light, before impinging on the illuminated portion, is guided between portions of a detection surface of the detector.

19. The device of claim 14, wherein the mask holder is tiltable.

20. The device of claim 14, comprising a synchrotron-based light source or a high harmonic generation (HHG) light source.

21. The device of claim 14, comprising a stop positioned at an illumination pupil, wherein the stop is configured to provide multiple illumination directions arranged at an edge of the illumination pupil.

22. The device of claim 14, comprising a stop positioned at an illumination pupil, wherein the stop is configured to provide multiple illumination directions that are distributed in a central radius of the illumination pupil.

23. The device of claim 22, wherein the stop is configured to provide multiple illumination directions that are distributed in a first central radius of the illumination pupil, and illumination directions that are distributed in a second central radius of the illumination pupil.

24. The device of claim 14, comprising a stop positioned at an illumination pupil, wherein the stop is configured to provide at least four illumination directions that are distributed in a central radius of the illumination pupil.

25. The device of claim 14, comprising a stop positioned at an illumination pupil, wherein the stop is configured to provide at least eight illumination directions that are distributed in a central radius of the illumination pupil.

26. The method of claim 1 wherein the several predetermined illumination directions comprise illumination directions that are arranged at an edge of an illumination pupil.

27. The method of claim 1 wherein the several predetermined illumination directions comprise multiple illumination directions that are distributed in a central radius of an illumination pupil.

28. The method of claim 27, wherein the several predetermined illumination directions comprise illumination directions that are distributed in a first central radius of the illumination pupil, and illumination directions that are distributed in a second central radius of the illumination pupil.

29. The method of claim 1 wherein the several predetermined illumination directions comprise four illumination directions that are distributed in a central radius of an illumination pupil.

30. The method of claim 1 wherein the several predetermined illumination directions comprise eight illumination directions that are distributed in a central radius of an illumination pupil.

* * * * *

UNITED STATES PATENT AND TRADEMARK OFFICE
CERTIFICATE OF CORRECTION

PATENT NO. : 11,079,338 B2
APPLICATION NO. : 16/451203
DATED : August 3, 2021
INVENTOR(S) : Ulrich Matejka et al.

Page 1 of 1

It is certified that error appears in the above-identified patent and that said Letters Patent is hereby corrected as shown below:

In the Specification

Column 2
Line 65, delete "Kithlke" and insert -- Kühlke --

Column 17
Line 34, delete "$I_a(p) = \left|17d^2ke^{iak}\hat{T}(k)\hat{I}(p-k)\right|^2$," and insert -- $I_a(p) = \left|\int d^2ke^{iak}\hat{T}(k)\hat{I}(p-k)\right|^2$ --

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*